United States Patent
Torres, Jr. et al.

(10) Patent No.: US 7,553,355 B2
(45) Date of Patent: Jun. 30, 2009

(54) METHODS AND MATERIALS FOR THE REDUCTION AND CONTROL OF MOISTURE AND OXYGEN IN OLED DEVICES

(75) Inventors: Robert Torres, Jr., Parker, CO (US); Tadaharu Watanabe, Iwatsuki (JP); Joseph V. Vininski, Boulder, CO (US)

(73) Assignee: Matheson Tri-Gas, Parsippany, NJ (US)

( * ) Notice: Subject to any disclaimer, the term of this patent is extended or adjusted under 35 U.S.C. 154(b) by 909 days.

(21) Appl. No.: 10/875,671

(22) Filed: Jun. 23, 2004

(65) Prior Publication Data

US 2005/0186123 A1 Aug. 25, 2005

Related U.S. Application Data

(60) Provisional application No. 60/480,919, filed on Jun. 23, 2003.

(51) Int. Cl.
*B01D 53/00* (2006.01)

(52) U.S. Cl. .......................... 96/117.5; 96/416; 96/418; 116/206; 210/94; 210/502.1; 313/553; 313/554; 257/682; 502/400; 502/401

(58) Field of Classification Search ............ 95/14, 95/15, 25; 96/414–416, 117.5, 418; 116/206, 116/219; 210/94, 95, 502.1, 483, 490, 496, 210/497.01; 422/55, 58, 82.05, 119, 56; 436/2.164; 502/406, 416, 400, 401, 402, 502/414, 415, 417; 313/502–506, 545–551, 313/553, 554; 257/678, 682; 372/43.01; 428/690, 691; 438/14; 702/136
See application file for complete search history.

(56) References Cited

U.S. PATENT DOCUMENTS

| | | | | |
|---|---|---|---|---|
| 2,526,938 A * | 10/1950 | Davis et al. | .................... | 436/41 |
| 2,560,537 A * | 7/1951 | Andersen | .................... | 116/219 |
| 3,512,939 A * | 5/1970 | Hugi | ............................ | 422/86 |
| 3,748,272 A * | 7/1973 | Wenz et al. | .................. | 252/194 |
| 3,990,872 A * | 11/1976 | Cullen | .............................. | 96/6 |
| 3,999,946 A * | 12/1976 | Patel et al. | ...................... | 422/56 |
| 4,195,056 A * | 3/1980 | Patel | ............................. | 422/56 |
| 5,159,564 A * | 10/1992 | Swartzel et al. | ............. | 702/136 |
| 5,513,198 A * | 4/1996 | Jakobson | ................. | 372/43.01 |
| 5,593,482 A * | 1/1997 | Dauber et al. | .............. | 96/117.5 |
| 5,685,986 A * | 11/1997 | Yamada et al. | .............. | 210/498 |
| 6,465,953 B1 * | 10/2002 | Duggal | ....................... | 313/553 |
| 6,620,632 B2 * | 9/2003 | Koveshnikov et al. | ......... | 438/14 |
| 6,890,373 B2 * | 5/2005 | Nemoto et al. | .................. | 95/90 |
| 2004/0127358 A1* | 7/2004 | DeRosa et al. | .............. | 502/406 |

* cited by examiner

*Primary Examiner*—Joseph W Drodge
(74) *Attorney, Agent, or Firm*—Townsend and Townsend and Crew LLP

(57) ABSTRACT

Novel uses and methods of use for inorganic and macroreticulate polymer bonding to metals to control moisture and oxygen in OLED, and other like devices, are provided. Materials having color change capacity are also provided for the removal of moisture from an OLED, where the material changes color upon reaching its capacity and thereby signals the user that the OLED is no longer protected from moisture damage.

38 Claims, 6 Drawing Sheets

METHODS AND MATERIALS FOR THE REDUCTION AND CONTROL OF MOISTURE AND OXYGEN IN OLED DEVICES

CROSS-REFERENCE TO RELATED APPLICATIONS

The present nonprovisional patent application claims priority to U.S. Provisional Application Ser. No. 60/480,919, filed on Jun. 23, 2003, entitled; METHOD AND MATERIALS FOR THE REDUCTION AND CONTROL OF MOISTURE AND OXYGEN IN OLED DEVICES, which is herein incorporated by reference.

BACKGROUND OF THE INVENTION

The present invention relates to limiting damage caused by moisture, oxygen and other like oxygenated contaminants to OLED (organic light emitting diodes), organic transistors, flat panel displays, and other like electronic devices.

It is known that performance of electronic devices can be impaired by contact with moisture, oxygen and other oxygenated species. For example, semiconductor devices are undesirably oxidized by water and oxygen, and thereby degraded during contact with the same. The damage to these devices can be caused by as little as trace levels of these contaminants, thereby exacerbating this problem.

OLEDs are optoelectronic devices based on small molecules or polymers that emit light when an electrical current flows through the device. The devices are commercialized in the area of displays, screens, and signs. In addition, several products are commercially available in the area of cell phones, stereo displays, monitors, and military applications. In general, these devices incorporate Indium-Tin-Oxide (ITO) films, a conductive transparent film, as the anode, and a thin film of elements like Ba, Ca, Mg, Al, and the like, as the cathode. Sandwiched in-between the electrodes are carbon based films. The organic films consist of a hole injection layer, a hole transport layer, an emissive layer, and an electron transport layer. Polymer layers are used to transport the electrons and holes that are injected into another polymer film such as a polyphenylenevinylene or a "small molecule" organic film such as rubrene or Tris(hydroxyquinolato) aluminum. Light of any color can be generated by the polymer film or "small molecule" by selecting different polymers, dopants for the polymers, or different small molecules.

One recurrent problem of conventional OLED's is their apparent limited lifetime. The 'brightness' of the device decreases over the course of several months as a result of pixel shrinkage causing the quality of the product to diminish and eventually become non-useable. Generally, pixel shrinkage within the OLED is associated with moisture and other like contamination, where moisture permeating through encapsulating materials and sealants interacts with pixel materials, i.e., moisture degrades the OLED by degrading the hole transport material or causing the cathode material to delaminate and degrade. Moisture may also directly attack the light emitting molecules.

To overcome this problem in the industry, desiccants have been included in one form or another within OLEDs. For example, solids such as alkaline metal oxides, alkaline earth metal oxides, sulfates, metal halides, alkali metals, alkaline earth metals, aluminum carbide, aluminum-magnesium alloy, barium nitride alloy, and perchlorate-based desiccant materials have been used to protect OLEDs from damage caused by moisture. In some cases these desiccants are blended with binders to remove moisture from environment surrounding the OLED. However, these solid materials generally have low surface area, and not enough capacity, to capture the water continuously permeating from the outside environment into the interior of the OLED. Additionally, these solid materials do not have the capability to remove oxygen that permeates into the device and thereby causes performance degradation.

An alternative approach to removing moisture from an OLED environment is to use a lithium metal and magnesium metal deposits. However, the deposited lithium and magnesium materials do not have high surface areas to capture impurities, i.e., have low capacity.

Finally, the use of silica and zeolite that generally have high surface area have also been used to remove moisture from OLED's. However, the nature of these materials to capture the moisture via physical adsorption does not provide enough efficiency to protect the OLED for long periods of time. Also, these materials tend to emit moisture depending on the temperature condition of the device environment, where the materials are being employed due to the adsorption equilibrium.

In addition, some of the aforementioned desiccant materials do not have any capability, or very low capacity, for removing oxygenated species other than water. Therefore, damage to these devices caused by other oxygenated species are not minimized by the above described desiccants.

In all such cases regarding the removal of moisture from an OLED, there continues to be a need in the art for more effective removal techniques of moisture, and other oxygenated species, from the environment of a device.

In addition, there is a need in the art to have a signal or indication as to allow the user to determine if and when a device is in jeopardy of being damaged by moisture and other contaminants. In such case, a user may be alerted to the impending reduction in device quality due to moisture damage, and not spend additional time or money attempting to diagnose these problems. Against this backdrop the present invention has been developed.

BRIEF SUMMARY OF THE INVENTION

An embodiment of the present invention provides materials and methods for removal of water and other oxygenated species from OLED and other like moisture and oxygenated species sensitive electronic devices. In particular, methods and compositions are provided that can increase the life-span of an OLED with materials that remove water and oxygenated species substantially irreversibly with highly efficiency and with high capacity. One embodiment of the present invention enables the removal of water and other oxygenated species down to part per billion (ppb) and even part per trillion (ppt) levels within the device. These results are much more effective than using other physical sorption based prior art desiccants.

The present invention also provides methods and compositions that indicate when the compositions and methods of the present invention have reached their capacity, and are no longer effective at removing moisture and other oxygenated species from the electronic device's environment. In one embodiment, the compositions of the present invention indicate their capacity via a simple to recognize color change.

The present invention further provides methods and compositions for the detection of moisture within an electronic device via a signaling mechanism for the purpose of diagnosing failure of the OLED, to facilitate whether the failure of the device is due to moisture, OLED materials, the manufacturing method, or some other failure mechanism.

These and various other features as well as advantages which characterize the invention will be apparent from a reading of the following detailed description and a review of the appended claims.

DETAILED DESCRIPTION OF THE INVENTION

Definitions

Figure 1:
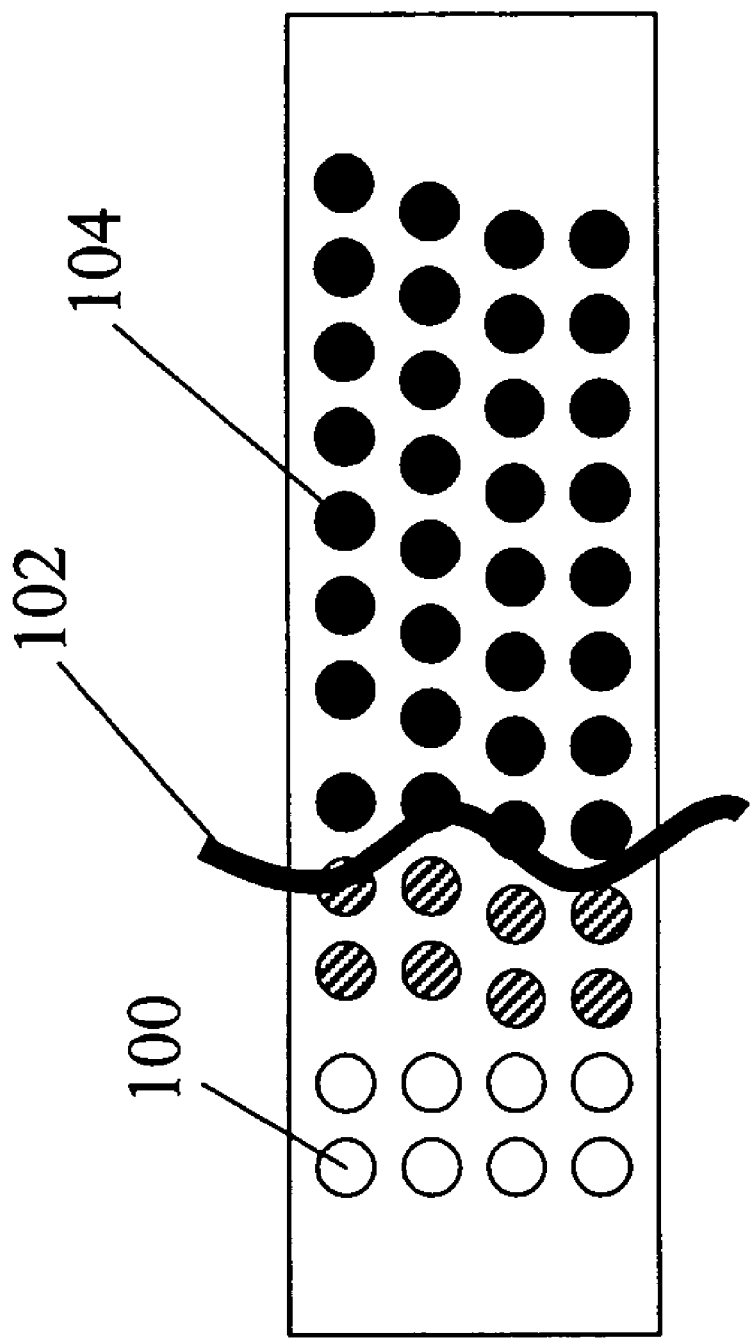
FIG. 1 illustrates one embodiment of the color change purifier material as viewed through a transparent window in an OLED or other like device.

The following definitions are provided to facilitate understanding of certain terms used frequently herein and are not meant to limit the scope of the present disclosure.

"Binder material" refers to any material used to secure the purifier material into one mass wherein the purifier material is no longer in loose or powder form.

"Electronic component(s)" refers to any component found within an organic light emitting diode or other like electronic device sensitive to moisture, oxygen or other like oxygenated species including organic transistors. An illustrative electronic component is a cathode.

"Identifier alert" refers to a means for visual or other like indication that an electronic device has been exposed to a target impurity that could cause degradation in device performance.

"OLED" refers to an organic light emitting diode, but is used interchangeably with other electronic devices that are sensitive to moisture and oxygen damage, for example organic transistor or OLED devices are used for illustrative purposes throughout the disclosure herein.

"Reduction, control or limitation" refers to a measurable decrease in the concentration of a target impurity within a defined environment. A reduction can be from a first level of target impurity to a lower second level of target impurity.

"Purifier material" refers to reactive agents having capacity to remove water and other oxygenated species from a local environment in accordance with the present invention.

"Target impurities" refers to oxygen, water, CO, $CO_2$, NO, $NO_2$, $N_2O_4$, $SO_2$, $SO_3$, SO, $S_2O_2$, $SO_4$ and the like and mixtures thereof that can damage and/or reduce the lifetime of an electronic device, for example an OLED.

The present invention provides compositions and methods for the reduction, control or limitation of moisture and other oxygenated species from the environment of an OLED or other like electronic device. Embodiments of the present invention are also useful in limiting or preventing moisture and other oxygenated species from entering the interior environment of an OLED or other like device. The present invention provides "purifier materials" that facilitate the reduction, control and/or limitation of moisture and other oxygenated species from an electronic device. In preferred embodiments the purifier material removes target impurities substantially irreversibly until the purifier material reaches its capacity.

The present invention also provides compositions and methods that present a visual signal that a purifier material has reached its capacity and should be replaced, or signal that the device in which the material is located is no longer protected by that purifier material. The present invention also provides electronic devices having integrated purifier materials, and in preferred embodiments, electronic devices having integrated purifier materials that change color with exposure to impurities, e.g., water and other oxygenated contaminants.

Purifier Materials of the Invention:

One embodiment of the invention describes a purifier material, i.e., reactive agent, that is chemically bonded or physically dispersed on high surface area substrates to increase contact toward a target impurity or impurities. Embodiments of the invention will increase the efficiency of removing moisture and other oxygenated species from an OLED containing environment. Purifier materials are integrated into electronic devices to limit or eliminate target impurities from the interior environment of a target device.

As briefly noted above, other devices susceptible to moisture damage are also included within the scope of the present invention, although most of the description will focus on electronic devices, and in particular to OLED devices.

Examples of purifier materials within the context of the present invention include but are not limited to, macroreticulate polymer bonding to metals as previously described in U.S. Pat. Nos. 4,603,148, 4,604,270, 4,761,395, 4,950,419, 5,015,411, 5,037,624, 5,340,552, 5,385,689, and 6,077,487, metal hydrides, $P_2O_5$, finely dispersed transition metals and metal oxides on high surface area substrates as previously described in U.S. Pat. Nos. 6,733,734, 6,110,258, 6,461,411, 6,241,955, and 6,059,859, and other purifier materials such as high surface area transition metals and carbon based materials as previously described in U.S. Pat. Nos. 6,521,014, 5,961, 750, and 6,425,946, and 6,066,591 Each of these patents is herein incorporated by reference in its entirety.

Several commercially available examples of these types of materials, included in the context of the invention, are Matheson Trigas' OMX®, IMX®, and O-Lifeguard® resin based materials, Mykrolis Corporation's family of reactive micro matrix (RMM) purification materials, as described in Mykrolis Microelectronic Applications Note MA020A, and Pall Corporation's Areskleen™ material. The present invention includes, but is not limited to, the following macroreticulate polymer based purifier materials for use in OLEDs. Macroreticulate polymer bonding to metals of the present invention may be represented by the formula (1). The symbol Ar represents an aromatic hydrocarbon radical containing from one to three rings; $R_1$ and $R_2$ are the same or different and are selected from the group consisting of hydrogen, alkyl hydrocarbon radicals containing from 1 to 12 carbon atoms, methylene-bridged benzophenone radicals, alkali or alkaline earth metal salts of methylene-bridged benzophenone; methylene-bridged fluorenone radicals and alkali or alkaline earth metal salts of methylene-bridged fluorenone. M is selected from the group consisting of lithium, potassium, sodium alkyl magnesium, and alkyl zinc where the alkyl groups are hydrocarbon alkyl radicals containing from 1 to 12 carbon atoms, said macroreticulate polymer having within its pores a metallating agent selected from the group consisting of alkyl lithium, alkyl sodium, alkyl potassium, dialkyl magnesium, alkyl magnesium halide and dialkyl zinc, where the alkyl group is an alkyl hydrocarbon radical containing from 1 to 12 carbon atoms; alkali or alkaline earth metal salts or benzophenone and alkali or alkaline earth metal salts of fluorenone, alkali or alkaline earth metal hydrides.

Formula 1:

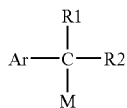

Macroreticulate polymers bonding to metals can be prepared from an active scavenging species, present on the support, formed by deposition on the support of an organometallic precursor compound of the formula $M(R)_2$, wherein M is a metal from Group 1A, IIA and IIIA, and R is alkyl, and pyrolysis thereof on said support at elevated temperature.

Ar can be considered as support material. Macroreticulate polymers can be formed from monomers selected from the group including but not limited to styrene, vinyltoluene, vinyliscpropylbenzene, ethylvinylbenzene, vinylnaphthalene, alpha-methylstryene, betamethylstyrene, divinylbenzene and divinylnaphthalene, and styrenedivinylbenzene. Other support materials include but are not limited to alumina, silica, aluminosilicates; kieselguhr; carbon; and mixtures, alloys, and mixtures thereof.

Organometallic precursors are selected from the group including but not limited to butyllithium, dibutylmagnesium, trimethylaluminum, triethylaluminum, and diisobutylaluminum hydride.

Purifier materials of the present invention may also include metals and metal hydrides of Group 1A, IIA and/or IIIA dispersed on organic support material, carbon support material and inorganic support material.

With regard to the inorganic support material, the inorganic support materials comprises a high surface area of alumina, silica, zeolite, aluminosilicate, metal oxides such as zirconium oxide, manganese oxide, iron oxide, titanium oxide. Also, reduced state transition metal oxides selected from the group including but not limited to oxides of molybdenum, antimony, bismuth, tin, chromium, cobalt, copper, tungsten, manganese, iron, nickel, vanadium, and chromium, and mixture thereof can be a support material.

Carbon support materials are typically activated carbon and graphite, although other like materials are envisioned to be within the scope of the invention.

In general, support materials of the invention preferably have more than 10 $m^2/g$ of surface area, although lesser amounts can be useful. The support materials can be used in the forms including but not limited to powder, pellets, tablet, granulate, sphere, film and sheets. The size of these pellets, tablet, granulate and sphere typically are in the range of 1 nanometer to 1 centimeter, and can have uniform or non-uniform shapes.

Accordingly, this invention includes finely dispersed transition metals and metal oxides on high surface area substrates.

The purifier materials of this invention can also comprise a thin layer of reduced forms of an oxide of a metal and/or metals deposited or coated onto the surface of organic, inorganic and carbon substrates. The reduced forms of the metal oxide thin layer coating include one or more reduced oxides of the metal in which the oxidation state of the metal is lower than the maximum oxidation state of the metal. In addition to the reduced oxides of the metal, the thin layer may further include the completely reduced form of the metal (i.e., the metal in a zero oxidation state).

This invention further provides methods of removing one or more contaminants from OLED environment using purifier materials of this invention that comprise a high surface area of inorganic, organic and carbon substrate having deposited thereon a thin layer of one or more reduced forms of a metal oxide. Typically the metal oxide is selected from the group consisting of oxides of molybdenum, antimony, bismuth, tin, chromium, cobalt, copper, tungsten, manganese, iron, nickel, vanadium, chromium, alkaline metal, alkaline earth metal and mixtures thereof.

In another embodiment of this invention, the purifier material comprises a high surface area of inorganic, organic and carbon substrate having deposited thereon a thin layer of one or more metals, wherein said metal is a transition metal and is selected from the group consisting of molybdenum, antimony, bismuth, tin, chromium, cobalt, copper, tungsten, manganese, iron, nickel, vanadium, chromium, alkaline metal, alkaline earth metal and mixtures thereof.

The purifier materials of the present invention have capacity for reducing the level of target impurities such as oxygen, moisture, CO, $CO_2$, NO, $NO_2$, $N_2O_4$, $SO_2$, $SO_3$, SO, $S_2O_2$, and $SO_4$ from an interior compartment of an OLED or the environment where OLED are packaged from parts-per-million levels down to sub-parts-per billion levels. In preferred embodiments, removal of target impurities to the purifier material is substantially irreversible, but limited by the capacity and amount of purifier material used within any particular device. As such, once the capacity of all the purifier material within a device has been exceeded the purifier material will no longer remove or control target impurity levels within the device.

As is described in greater detail below, the purifier materials of the present invention are incorporated into OLED and other like electronic devices to prevent and/or limit the damage caused by moisture and other like oxygenated contaminants to electronic components within the device.

In an alternative embodiment of the present invention, a "color change purifier material" is positioned to allow visual inspection of the material within the OLED so as to indicate when the material has reached capacity, i.e., the color change purifier material changes color as it absorbs/adsorbs/traps target impurities from a first color to a different second color. Typical color change materials are blended or incorporated into purifier materials of the present invention, the combination of a purifier material and color change indicator is referred to herein as a color change purifier material. In general, color change purifier materials include a ratio of from about 1:100 color change material:purifier material to 1:2 color change material:purifier material, and is preferably about 1:4 color change material:purifier material. In this respect, color change purifier materials can provide a gradation of color to show the current capacity of the material and whether the material needs to be replaced, where appropriate, or when the material is simply exhausted, where replacement is not feasible.

Color change of the color change material is due to reaction with an oxygenated species such as moisture or oxygen, can indicate a leak pathway in the device prior to device failure. The device failure mechanism can be directly correlated to the moisture and oxygen concentration within the device by a simple visual inspection of the color changing material within the device. In this manner, if a device fails due to other mechanisms such as high current density or inherent problems with the light emitting materials, it will be possible to delineate this failure mechanism from device failure caused by moisture and oxygen degrading electronic components within in the device.

By combining the stated purifier materials above with a color change material, the color is changed due to adsorption of moisture on it, and it can thereby provide a lifetime indication of the purifier material. A color change purifier material that changes it's color due to the adsorption/absorption/trapping of moisture can be a material including but not limited to cobalt chloride and other transition metal complexes, phosphorus pentaoxide (P2O5), and other like compounds. In addition, several purifier materials, including Matheson Trigas' OMX material have the inherent property of changing color upon interaction with moisture and other oxygenated species.

As an illustrative example of a color change purifier material useful in the context of the present invention, cobalt chloride can be incorporated into a purifier material of the present invention and further incorporated into a target electronic device along or viewable through a transparent panel or window. The cobalt chloride is a color indicator that will change color due to interaction with target impurities. The cobalt chloride remains blue in the absence of target impurities, an indication that the electronic device is protected from target impurities. However, if the cobalt chloride turns pink or begins to transition to a pink color, there is a real danger to the electronic device from target impurities, e.g., target impurities are present in the electronic device and the purifier material has reached capacity for removing the material. In this situation the electronic components of the device are no longer protected from target impurities.

Further, with regard to the color change purifier materials, some materials change color due to a change in the materials oxidation state (especially where the color change purifier material is a transition metal complex). However, color of the material can also or alternatively be affected by a change in the coordination of different molecules or ligands to various metal complexes.

Note that combinations of color change purifier material and purifier material, discretely positioned within a device, can be used in the context of the present invention.

In another embodiment of the invention, the purifier material comprises a high surface area of reduced state metal oxide. In this embodiment, substrate itself is a reactive agent. Said metal oxide is metal oxide of a transition metal and is selected from the group including but not limited to molybdenum, antimony, bismuth, tin, chromium, cobalt, copper, tungsten, manganese, iron, nickel, vanadium chromium, and mixtures thereof.

Examples of substrates suitable for purposes of this invention include, but are not limited to, alumina, amorphous silica-alumina, silica ($SiO_2$), aluminosilicate molecular sieves, titania ($TiO_2$), zirconia ($ZrO_2$), high surface area of transition metals, stylene polymer, any types of high surface polymer, and carbon. The substrates are commercially available in a variety of shapes of different sizes, including, but not limited to, beads, sheets, extrudates, powders, tablet, granules, etc. The surface of the precursor substrate can be coated with a thin layer of a particular form of the metal (e.g., a metal oxide or a metal salt) using methods known to those skilled in the art, including, but not limited to, incipient wetness impregnation techniques, ion exchange methods, vapor deposition, spraying of reagent solutions, co-precipitation, physical mixing, etc. In addition, many such coated precursors are commercially available.

The terms "metal having a first oxidation state" and "first form of a metal" are used interchangeable and refer to the form of the metal comprising the thin layer coated onto the surface of the precursor. For example, in one embodiment the precursor coating comprises a thin layer of a metal having a first oxidation state which is consequently treated to produce a purifier material comprising a reactive or nonreactive substrate coated with a thin layer of one or more oxides of the metal having a second, lower oxidation state. In another embodiment, the precursor coating comprises a first form of the metal wherein the first form is other than a metal oxide. In this embodiment, the precursor is treated to produce a purifier material comprising a reactive or nonreactive substrate coated with a thin layer of a metal oxide having the same oxidation state as the first form of a metal. Examples of a "metal having a first oxidation state" and "first form of a metal" include, but are not limited to, an oxide, a salt, an acid, an organic complex or an inorganic, complex of the metal. Examples of metals suitable for purposes of this invention include, but are not limited to, vanadium, molybdenum, antimony, bismuth, tin, cerium, chromium, cobalt, copper, tungsten, manganese, iron, and mixtures thereof. Suitable metal salts from purposes of this invention include, but are not limited to, nitrates, carbonates, oxalates, etc.

In another embodiment, the purifier materials further comprise an alkaline metal, alkaline metal oxide, or alkaline metal hydroxide deposited over the metal oxide thin layer and/or mixed in with the metal oxide thin layer. Alkaline metals include lithium, sodium, potassium, rubidium, and cesium.

In general, the final purifier material comprises about 1 to 90% of the reduced forms of the metal and the metal oxide and about 10 to 99% of the substrate. For example, in one non-limiting embodiment the final purifier material comprises about 5-30% of the reduced forms of the metal and the metal oxide and about 70-95% of the substrate. Further, the total surface area of the thin layer of the final purifier material is generally between about 20 $m^2$/g and 1200 $m^2$/g. A preferred embodiment has a total surface area of final purifier material of about 800 $m^2$/g. In another embodiment, the total surface area of the thin layer of the final purifier material is between about 10 and 300 $m^2$/g.

As used herein, the terms "reduced forms of an oxide of the metal" and "metal oxide having a second, lower oxidation state" refer to one or more oxide forms of the metal in which the metal has a lower oxidation state than that of the metal in the precursor thin layer. The thin layer of a final purifier material of this invention may contain one or more different metal oxides. Thus, the term "second oxidation state" is not limited to one specific oxidation state, but rather encompasses different forms of the metal, wherein each of the metal oxides in the purifier material coating has an oxidation state that is lower than that of the metal of the precursor coating. The term "reduced forms of an oxide of a metal" also encompasses zero valent metal.

For example, in one non-limiting embodiment the metal oxide thin layer of a precursor is a molybdenum oxide. Molybdenum is known to form at least four oxides, which are, in descending order of oxidation state of molybdenum, $MoO_3$, $Mo_2O_5$, $MoO_2$, and $Mo_2O_3$. Thus, if the precursor comprises a thin layer of $MoO_3$ (in which the oxidation state of Mo is +6), then the reduction step can produce a final purifier material having a thin layer that contains one or more of the lower oxides of molybdenum, including $Mo_2O_5$, $MoO_2$, and $Mo_2O_3$. In addition to the one or more reduced forms of molybdenum oxide, a percentage of the thin layer of the purifier material may also contain metallic molybdenum (Mo), i.e., molybdenum in its zero oxidation state. The composition of the thin layer of the purifier material will of course depend on the amount of time the precursor is exposed to hydrogen gas during the reduction step, as well as the temperature during the reduction (see below). Alternatively, if the precursor comprises a thin layer of $Mo_2O_5$ (in which the oxidation state of Mo is +5), then the thin layer of the final purifier material may comprise one or more of the lower oxides of molybdenum, including $MoO_2$ and $Mo_2O_3$, and may further contain molybdenum in its zero oxidation state (Mo).

It is not necessary that the first oxidation state of the metal in the precursor thin layer be the maximum oxidation state for that metal. However, at least a portion of the metal in the final purifier thin layer is a reduced metal oxide. That is, in one embodiment at least a portion of the metal in the thin layer of the final product is between the first oxidation state of the metal of the precursor layer and the zero oxidation state of the metal.

In yet another embodiment of this invention for removing target impurities from OLED environment and manufacturing process, the purifier material comprises a substrate having deposited thereon a thin layer of metals and one or more reduced forms of an oxide of a metal from Group 3b metals (scandium, yttrium, and lanthanum) Group 4b metals (titanium, zirconium and hafnium), vanadium, and lanthanide metals (cerium, praseodymium, neodymium, samarium, europium, gadolinium, terbium, dysprosium, holmium, erbium, thulium, ytterbium and lutetium).

Methods of Manufacture

The present invention provides methods of removing target impurities including, but not limited to, oxygen, moisture, CO, $CO_2$, NO, $NO_2$, $N_2O_4$, $SO_2$, $SO_3$, SO, $S_2O_2$, and $SO_4$ from OLED devices, organic transistors and other moisture sensitive devices, and from the manufacturing process of fabricating OLED devices. The purifier materials produced by the methods of this invention are capable of reducing the level of contaminants in OLED environment and manufacturing process from parts-per-million levels down to sub-parts-per-billion levels.

In one embodiment of the invention, a purifier material is produced by a method comprising:

(a) providing a precursor comprising a high surface area substrate having deposited thereon a thin layer of a metal of a first oxidation state;

(b) heating the precursor under a flow of inert gas like nitrogen at a temperature between about 100° C. and 600° C. for a period of time; and (c) treating the precursor from step (b) under reductive conditions sufficient to reduce the oxidation state of the metal in the precursor thin layer, thereby producing a purifier material comprising a substrate having deposited thereon a thin layer of one or more reduced forms of metals and an oxide of the metal of a second oxidation state, wherein the second oxidation state is lower than the first oxidation state.

The purified material can then be incorporated into a target electronic device or be temporarily used to prevent moisture and like contaminants from entering the OLED during the manufacturing process. Purifier materials of the invention can be incorporated into glues, binders, tapes, films and other like materials for use in an OLED (see below). In each case, an appropriate amount of purifier material is incorporated into the device to facilitate the lifespan of the device.

Devices

Note that the following description of electronic devices incorporating color change purifier materials can be expanded to include electronic devices incorporating any purifier material of the present invention. The purifier materials would provide the benefits of limiting or eliminating target contaminants but without an indicator of the device or purifier material lifespan. However, only color change purifier materials are addressed below in the context of the disclosure, but it is envisioned that non-color change purifier materials incorporated into OLED devices are within the scope of the present invention.

Currently, OLED's and other display devices utilize desiccants within the device to capture the moisture once the moisture permeates into the interior of the device. The materials described in previous art have been selected from the group consisting of alkaline metal oxides, alkaline earth metal oxides, molecular sieves, silica, zeolites, sulfates, metal halides, perchlorates and metals with work functions less than 4.5 eV. Although these materials will remove moisture from the device, these materials are inferior to purifier materials of the present invention that could be used within the OLED devices. The purifier materials of the present invention are better suited for this application, and have been described previously in this disclosure. In addition, previous art desiccants do not provide a signal as to their capacity or to the actual presence of target impurities during use.

One of the advantages and novelty of purifier materials of the present invention is to serve or act as diagnostic tools for moisture or other target impurity permeation into an OLED. Moisture has been reported to be the root cause of failure for most electronic devices, especially OLEDs. Moisture can degrade multiple components within a device such as the cathode, the hole injection layer, or the emissive layer. It has been reported by Borrows et. al, APL, 65, 2922 (1994) that elimination of moisture from the device reduces dark spot formation within the device. A dark spot can be characterized by a pixel location that no longer emits light from that location or the emission area has been reduced significantly. Other previous work by McElvain et al, JAP, 80, 6002 (1996) demonstrated dark spot formation when moisture enters and causes cracks in the cathode. Since the cathode is typically a metal with low work functions, deposited between the polymeric materials and the conductive substrate of the device, moisture will oxidize the cathodic material and cause delamination of the cathode from the conductive substrate. Once delamination of the cathodic material occurs the device will no longer function in that area since electrical current can no longer flow through the device in that area.

Although moisture, and to a lesser extent, oxygen has been reported to be a failure mechanism for OLED and similar devices, other failure mechanisms exist within the device. Aziz et al, Science, 283, 1900 (1999) demonstrated that unbalanced charges or excessive holes in the device caused a rapid decay of the luminescence. There are many other failure mechanisms formulated for the less than desired lifetimes of the devices. Therefore, the color change purifier materials proposed in this invention have a unique and distinct advantage over traditionally used materials for this application. Since some of the purifier materials proposed in this invention have the ability to drastically change colors once exposed to moisture, these types of materials can serve as diagnostic tools for the failure mechanism of the device. FIG. 1 illustrates how the color change purifier material changes color, or shade of same color, once the material has been exposed to an oxygenated or other like species (as indicated by a black and white scale in the Figure).

As shown in FIG. 1, light colored spheres on the left 100 indicate that the color change purifier material has reacted with water and has changed colors from a dark material to a light material. The curved line 102 represents the boundary where moisture has permeated. To the right of the curved line, the color change purifier material 104 remains un-reacted and available to absorb moisture as it permeates in from the left side of the diagram. If the entire panel of color change purifier material had changed color, the panel would indicate that the device within which the material is located would no longer be protected from target impurities.

It is clearly evident that the use of desiccants is necessary to extend the life of the OLED devices, as shown in previous work. USDC Flexible Displays and Microelectronics Conference Proceedings, Feb. 10, 2004, Phoenix, Ariz., or The Global Flat Panel Display Industry "2003", Norman Bardsley, U.S. Display Consortium, 2003, Chapter 17, pp. 67-69.

The use of color changing purifier materials can offer the ability to determine when the device is exposed to moisture prior to device failure.

Since the nature of some of the devices are to emit light, all or most aspects of at least one side of the device must be transparent or substantially transparent. However, a much more desired situation is where both sides of the device are transparent. In cases where both sides of the electronic device are transparent (as is the case for top emitting OLED devices), it may be possible to disperse the color change purifier material of the invention around the device in a pattern that goes around the outer circumference of the light emitting device. It may also be possible to disperse the color change purifier material in a groove inside a glue line of the device such that the material stands between the OLED device and the sealant. Furthermore, it may be possible to mix the aforementioned inventive color change purifier materials in the glue to sealant or epoxy of the device. Therefore, it should be possible to disperse color changing materials within such a device and visually determine when the material is consumed and more importantly when the device will then be exposed to moisture. This situation allows for the direct correlation of moisture concentrations to device lifetime. In cases where the color change purifier material is patterned around the outer circumference of the device, defects can be visualized via any areas where the color change purifier material changes color to indicate target impurity retention.

In other embodiments of the present invention, the device may include a small window for viewing only a portion or fraction of the color change purifier material, for example view one or more discrete spheres or wafers. A user could thereby use the window as a relative indicator of the state of the purifier material within the device. Further, mixtures of color change purifier material and non-color change purifier material could be positioned within the same device—as long as a portion of the color change purifier material is visible and indicative of the presence of target impurities within the device.

In addition to the methods described previously, it may also be possible to disperse the purifier materials into the actual device layers such as the hole and electron injection layers and the emissive layer, if the purifier material is small enough not to affect the electrical and performance properties of the device. The purifier material could be dispersed into the various layers during the time of manufacture for the various layers. For example, many of the layers are deposited via a spin coating technique. By introducing the purifier materials into the casting solution used for spin coating, the active purifier materials can be introduced into the various layer during the time of manufacture. Similarly, the purifier materials can be introduced into the manufacturing process of other deposition techniques.

Determinations of the amount of purifier material or color change purifier material to include within a target devices are based on the source of the purifier material, including the materials capacity (see purifier material section above), the size of the device, the circumference of the device, for example the glue line circumference of the device, the permeability of the binder material, and the potential levels of target impurities within the device environment. For example, approximately 0.5 ml of a 100% organometallic reactive agent and a macroreticulated substrate is required for a 2 inch device (e.g., 0.5 ml Matheson Trigas' OMX® per 2 inch device).

In addition, it is possible to determine the performance status of the color change purifying material prior to introduction into the electronic device. This is accomplished visually or by other optical methods. Visual color changing materials within OLED devices could also be used as a final quality control check prior to shipping the device to a customer. The quality control check could be operated without operating and illuminating the device, but via a simple inspection of the color change purifier material. Traditional desiccant materials have no indication if the material has been properly activated and is ready for use within the device. It is possible that these traditional types of materials require reactivation by the OLED device manufacturer to ensure the material is dry and ready to function properly within the device. This costly and time consuming process could be avoided if it can be ascertained that the material is activated and ready for use by visual observations or optical methods of detection. The aforementioned visual observation or optical method of detection can be easily implemented with the material embodiments proposed and described within this invention. Although it has not been reported what critical moisture concentrations are necessary to avoid device degradation, it is generally believed that ppm levels of moisture can negatively affect the device performance. USDC Flexible Displays and Microelectronics Conference Proceedings, Feb. 10, 2004, Phoenix, Ariz., or The Global Flat Panel Display Industry "2003", Norman Bardsley, U.S. Display Consortium, 2003, Chapter 17, pp. 67-69. By using the color change purifier materials described within this disclosure it is possible to predict when the device will fail since the color change purifier material will likely change color prior to device lifetime failure. This feature is advantageous for end users who require 100% uptime for the light emitting device. Also, this feature could be used to give a warning or signal to the end user that the device is near failure and another device should be procured shortly.

Figure 2:
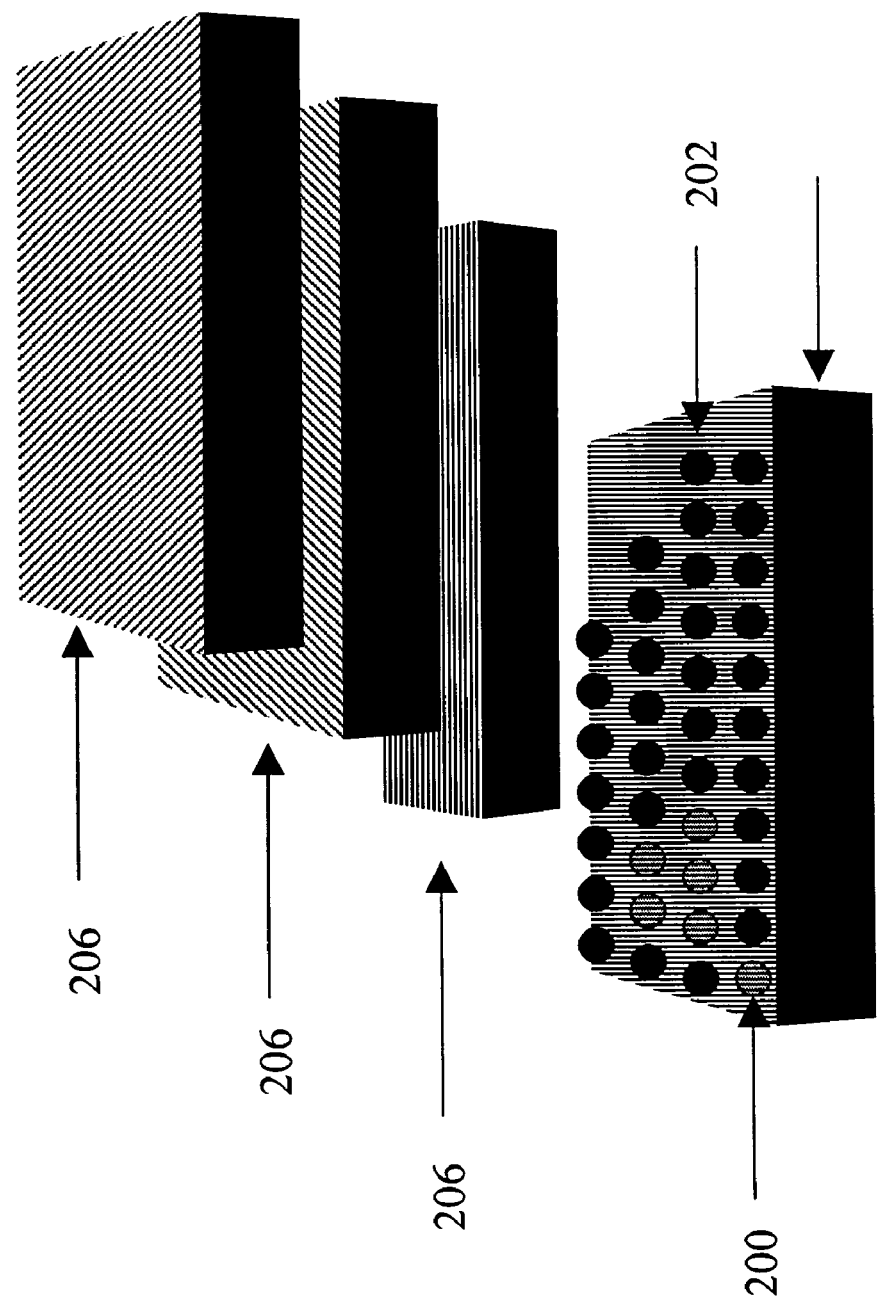
FIG. 2 illustrates one embodiment of the color change purifier material as used to indicate a leak, i.e., source of contaminant, in an OLED device.

The use of color changing purifier materials described within this invention for these types of applications has the ability to indicate when the purifier material is consumed and more importantly, predict when the device will be exposed to moisture and ultimately fail. However, in addition to serving as a device lifetime predictor and indicator, the color changing purifier material can serve as a diagnostic tool for the fabrication of the devices. Since the materials change colors and can be dispersed throughout the devices, the color changing purifier materials will provide direct information on location of moisture and oxygen intrusion (see FIG. 1). This information could point to manufacturing defects, and material defects, that would otherwise go un-noticed. The ability to determine problematic locations within the device is critical in identifying solutions to the problem of device failure. It may also be possible to test different materials such as glues, epoxies, sealants, barrier layers, etc., in side by side tests within one device to obtain material performance data. It may also be possible to identify non-uniformities in the manufacturing process such as glue line thickness and width, non-uniform placement of the materials within the device, and many other failure mechanisms. Additionally, if the device fails and the color changing purifier material indicates that there is no moisture within the device, the design engineer can immediately discard the failure mechanism of moisture intrusion into the device as the source of failure. By eliminating the moisture as a failure mechanism, the design engineer can save valuable time and resources by not investigating moisture as a root cause of failure. Typically, devices are built to completion and then undergo accelerated lifetime tests. This test can take up to several months to complete and is costly since the entire device must be fully fabricated using valuable equipment time and valuable material. It is believed with the advent and utilization of the color changing purifier materials, much of the testing conducted to determine the moisture effects on the device can be conducted faster, less expensive, with higher sensitivity, and with more definitive and conclusive results. FIG. 2 shows that if the color changing purifier material is dispersed throughout the OLED device, it can serve as a method to determine where moisture is intruding the fastest into the device. This allows the device designers to select new designs and new materials that minimize moisture intrusion areas.

In particular, and for illustrative purposes, FIG. 2 illustrates a color changing purifier material reacting with moisture or oxygen from a corner defect in the OLED device (see arrow 200). The change in the color demonstrates the location and probable leak mechanism within the device (as compared to arrow 202). Note substrate 204 and OLED layers 206.

The color change purifier materials described in the present invention also have a greater propensity to be used in fully flexible devices. Current traditional desiccant materials are used in the form of inflexible tablets or films that can break or delaminate during flexible operations of the device. Alternatively, prior art has demonstrated the use of liquids to disperse the materials into the devices in the form of pastes, binders, or gels. The color change purifier materials for this invention includes but is not limited to unconnected discrete shapes in the form of spheres, rods, and irregular shapes or any shape where in one discrete material is not connected to each other as in thin films, tablets, sheets, or wafers. Note also that the color change purifier materials can also be shaped to provide a symbol associated with material exhaustion, for example, the material can spell out a word, e.g., GOOD, which disappears over the lifetime of the device, when the material is no longer providing protection to the device, or alternatively, changes color upon exhaustion to spell out PINK MEANS EXHAUSTED.

The use of binders or pastes as described in U.S. patent application 20030037677 is also suited for this application, since moisture must first slowly permeate through the binder before it can reach a color change purifier material site that will react or absorb the moisture. Binders used for this type of application have been previously discussed in U.S. patent application 20030037677, which is incorporated by reference herein in its entirety. Note that the volatile nature of the binders used can absorb onto the color change purifier materials and compete with water for the color change purifier material sites responsible for removal of water. Although color change purifier materials can be fixed within a device by glues, epoxies or binders, it is believed that other methods can be used to immobilize these materials. Such methods can permanently or temporarily immobilize the material within the device. The methods of moving or immobilizing the color change purifier material within the devices include but are not limited to electric fields, magnetic fields, vacuum positioning or air curtains. These moving or immobilizing processes are generally known within the art.

Figure 3:
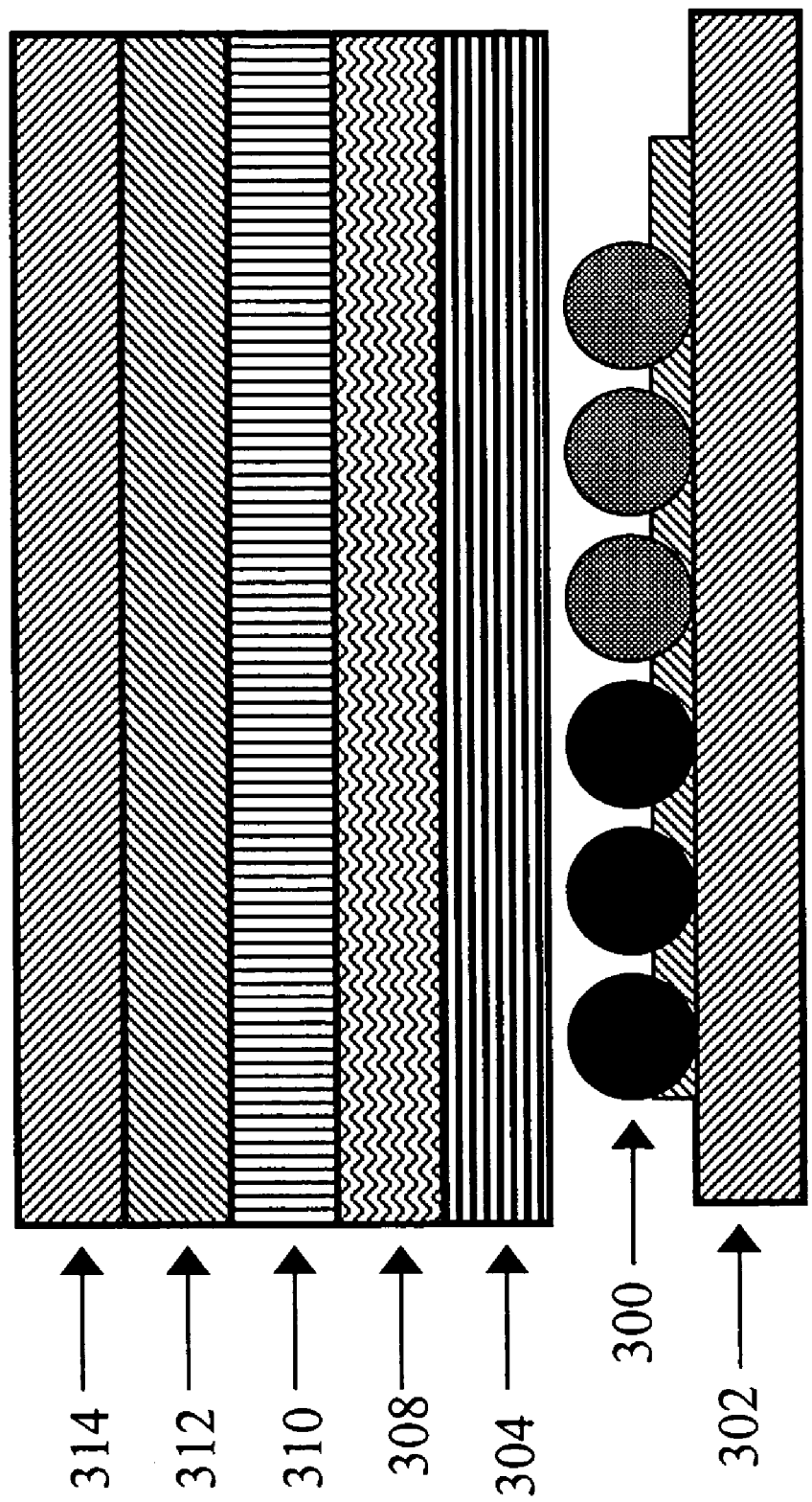
FIG. 3 schematically illustrates a color change purifier material attached to an inflexible OLED device.

In a preferred embodiment, spherically shaped organometallic beads described by U.S. Pat. No. 4,950,419, by Tom Glenn, et al. (which is herein incorporated by reference in its entirety), can be dispersed into the device in a manner where the color change purifier beads are attached to the substrate via a thin layer of flexible adhesive, solvent or glue. The beads are immobilized onto a flexible adhesive and can easily tolerate mechanical stresses involved with flexing and bending of the substrate. FIG. 3 illustrates how the beads are immobilized onto a flat substrate such as glass or metal. Purifier material 300 is placed between a protective glass 302 and a polymer cathode 304. The material 300 is incorporated into an adhesive film 306. Also shown are the electron injection layer 308, emissive polymer layer 310, hole injection layer 312 and polymer anode 314.

Figure 4:
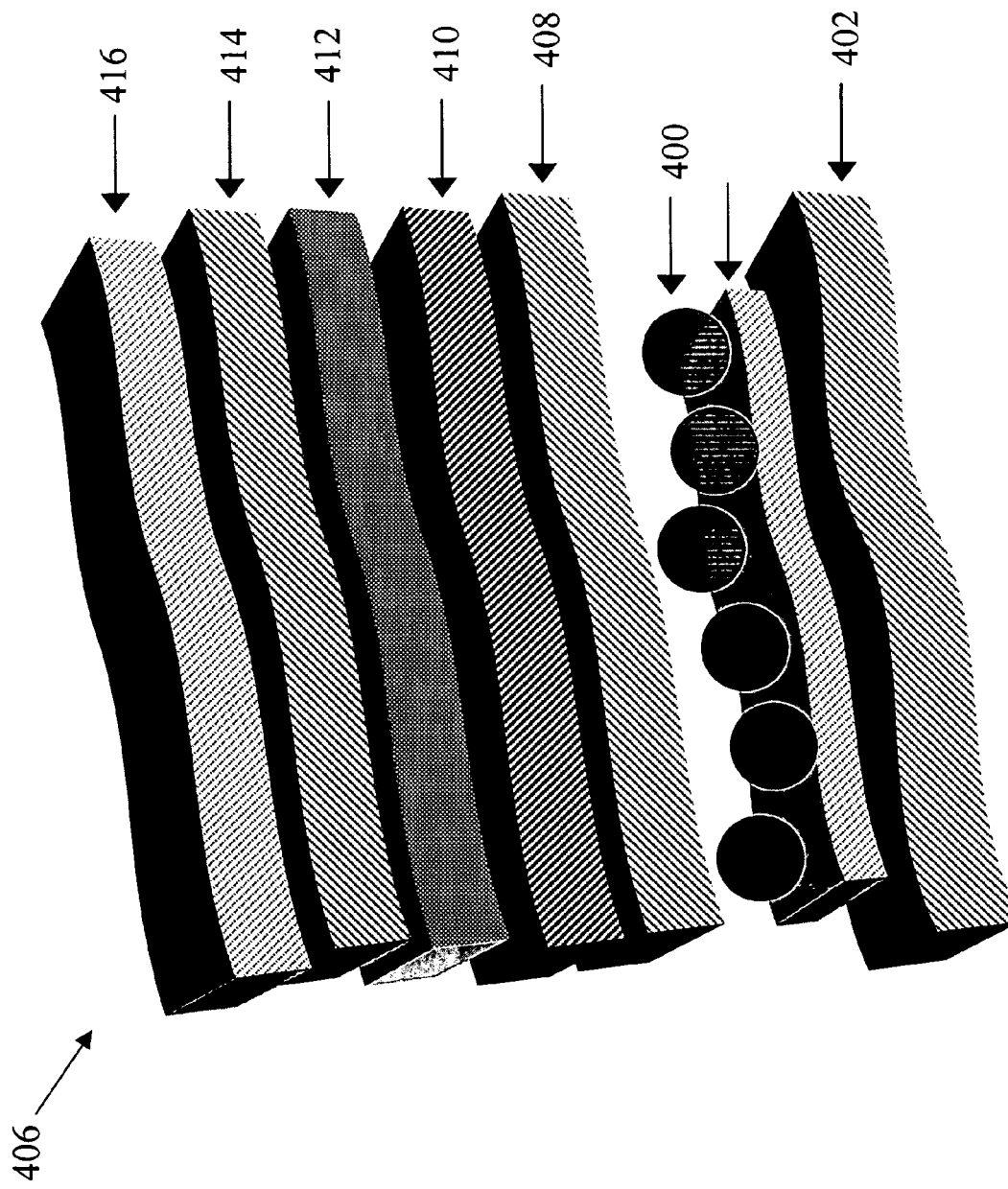
FIG. 4 schematically illustrates a color change purifier material flexibly attached to a substrate in an OLED device.

The need for flexible electronic displays and devices has been considered for many years. The flexibility will cause the color change purifier material to have new applications, but more importantly, the device can be manufactured in a process described as roll to roll processing. The Global Flat Panel Display Industry "2003", Norman Bardsley, U.S. Display Consortium, 2003. With the advent of roll to roll processing for the OLED and similar devices, the cost of manufacturing is expected to decrease significantly compared to current wafer batch processing. Thus, the need for a fully flexible device is immediate and significant. FIG. 4 shows how the color change purifier material 'beads' 400 can be attached to a flexible substrate 402 and conform to the non-uniform and uneven surface, and remain attached during flexing, motion and movement.

FIG. 4 is a schematic diagram illustrating the Matheson Trigas OMX® purifier material attached to a fully flexible OLED device 406. Also shown are the polymer cathode 408, electron injection layer 410, emissive polymer layer 412, hole injection layer 414 and polymer anode 416.

The beads 400 will not be affected adversely if the substrate flexes, bends or is stressed. In addition to spherically shaped purifier materials, the materials can take the form of any shape that best suits the device configuration and geometry. In addition to forming the beads into geometric shapes that are best suited for the device geometry, the organic or plastic based materials can be formed by various methods including but not limited to thermo-plastically formed, extruded, or compression molded into different macrogeometric shapes that will fit the desired shape and form. In another preferred embodiment, the raw material plastic beads described by U.S. Pat. No. 4,950,419, which is incorporated herein by reference in its entirety, by Tom Glenn, et al., can first be formed into a desired shape such as a 1 inch square that is less than 1 mm thick. The flat square shape can then undergo the chemical reaction that allows the plastic starting material to act as a desiccant. Once the plastic square shape has been reactively and chemically activated, it can be placed into the device as a singular piece of material that will react with water and oxygen as these impurities enter the device. The singular piece of formed material can then be immobilized into the device by glues, adhesives, sealants, and binders. In a preferred embodiment, the purifier material is shaped as a bead and applied in an organic solvent or adhesive which is evaporated or dried to operatively attach the bead to the protective polymer glass. In another preferred embodiment, the purifier material is encapsulated into a film or diffusion barrier in which the purifier is protected from the atmosphere until time of manufacture. Alternatively, the purifier material can be encapsulated in a tape of film and the entire tape or film then gets incorporated into the device.

The following three examples are illustrative in nature and are not meant to limit the scope of the different embodiments of the invention.

EXAMPLES

Example 1

Deposition of Cerium Nitrate onto Alumina by Incipient Wetness Impregnation

Alumina was modified by $Ce(NO_3)_3:6H_2O$ to form a cerium oxide coating (150-200 $m^2$ g) on the alumina using an incipient wetness impregnation technique. About 222 mL (122.77 g) of alumina beads was dried in a vacuum oven at about 110° C. overnight, then cooled to room temperature under vacuum. To this was added a solution of 19.0 g $Ce(NO_3)_3:6H_2O$ in 36.8 g $H_2O$ dropwise in a 600 mL beaker. After about 30-40 minutes, all of the solution was added without any observation of outside wetting of the alumina beads. The material obtained was capped by aluminum foil and allowed to equilibrate at room temperature for about 20 hours. The material was then heated to about 110° C. for about 20 hours in a vacuum oven. A sample of the obtained (dry) $Ce(NO_3)_3$:$6H_2O/Al_2O_3$ (containing about 5% Ce) was analyzed by thermogravimetric analysis using a TGA-7 thermogravimetric analyzer from PerkinElmer. Two peaks were obtained, one at about 200° C. and the other at about 400° C. The peak at about 200° C. is moisture (as in $Al_2O_3$) and the peak at about 400° C. (not found in $Al_2O_3$) was due to nitrate decomposition. Decomposition starts at about 280° C. (at 20° C./min heating rate) and is complete at about 550° C.

Example 2

Efficiency and Capacity Changes of Materials as a Function of the Temperature

The efficiency of molecular sieve material was tested for capturing water at different temperatures and it was found that the capacity for moisture varied significantly as a function of temperature as shown in Table 1. The temperature dependence is an important parameter since it can affect the device operation. It is well known that materials that operate on the principle of physisorption such as molecular sieves, silica, zeolites, etc., can reversibly absorb moisture. At room temperature molecular sieve 4A will absorb 9.2 liters of moisture per liter of 4A material. However, if the temperature of the material is increased, previously absorbed moisture can now be emitted from the device causing the electronic device to fail. Since the applications for the devices are hand held cellular phones, and portable devices, it can be reasonably estimated that the device will be exposed to a large temperature variations. Thus, it is believed that the materials based on physisorption are not well suited for use within OLED and other electronic devices.

TABLE 1

Capacity degradation of MS 4A due to temperature and efficiency.

| Efficiency | EQM $H_2O$ | Capacity, liter $H_2O$/liter 4A mol sieves at | |
|---|---|---|---|
| (ppm $H_2O$) | Conc Psia | 0° C. (32° F.) | 25° C. (77° F.) |
| 0.01 | $1.47 \times 10^{-7}$ | 3.3 | 1.7 |
| 0.1 | $1.47 \times 10^{-6}$ | 18.5 | 9.2 |
| 1 | $1.47 \times 10^{-5}$ | 43.0 | 30.0 |

EQM = Equilibrium,
Conc = Concentration

Figure 5:
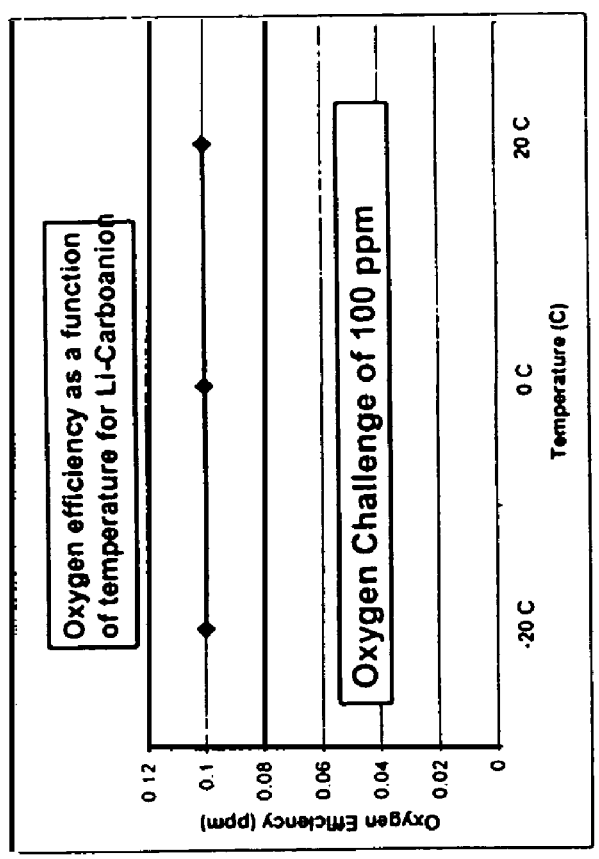
FIG. 5 illustrates the stable efficiency of Li-carboanion and lithium hydride on divinyl benzene beads.
Figure 6:
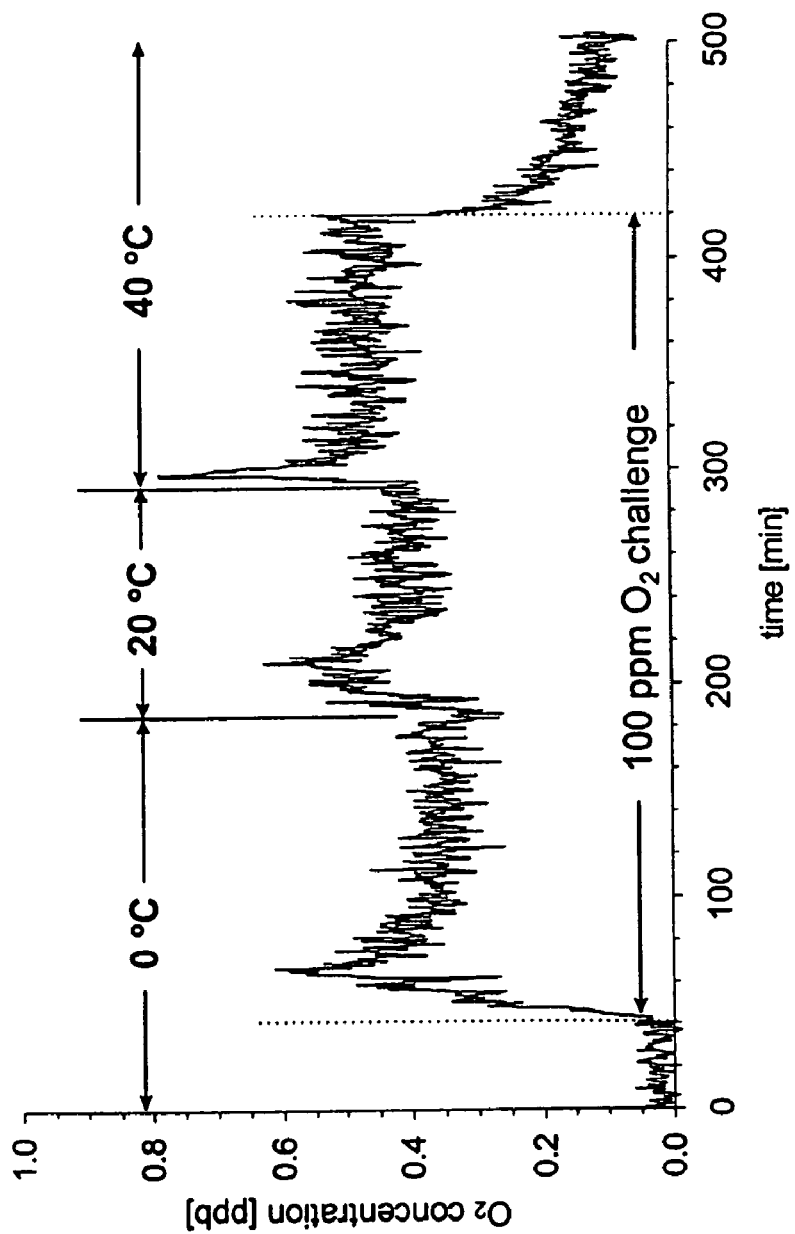
FIG. 6 illustrates the efficiency of Matheson Trigas OMX® material as a function of temperature.

Alternatively the material prepared as described herein did not show any difference in efficiency and capacity at different temperatures as shown in FIG. 5 and FIG. 6. The material was prepared as follows. Macroreticulate polymer bonding to metal can be prepared by the following method. Macroreticulate polymer backbone is poly(styrenedivinylbenzene). Metallating agent is tert-butyllithium. Macroreticulate polymer scavenger containing pendant functional groups is subsequently purified by heating to a temperature of about 140.degree. to about 250.degree.C. for several hours. Polystyrene-divinylbenzene and tert-butyllithium are mixed in the controlled temperature bath to formulate Li-carbanion and lithium hydride on the poly-styrene beads.

Since the OLED device lifetime is directly related to amount of moisture that enters the device. The device lifetime is severely shortened when moisture comes into contact with the emissive and injection layers of the device. Once the OLED has been manufactured, it must be protected from moisture by placing a desiccant next to the device and encapsulating the device and desiccant within a polymeric, metal or glass barrier designed to minimize the permeating of moisture. If the device is encapsulated with glass or metal, then the sealant used to attach the encapsulation lid to the glass or metal substrate becomes the area in which significant levels of moisture permeate into the device.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

The content of all publications, patents, and patent documents described and cited herein are incorporated by reference as if fully set forth.

Example 3

Non-limiting and Un-exhaustive List of Possible Substrates and Reactive Agents Used for the Invention Described Herein.

TABLE 2

Matrix of Examples of Macroreticulated Substrates and Organometallic Reactive Agents.

| | styrene | VT | VIB | EVB | VN | AMS | BMS | DVB | DVN | PPYR |
|---|---|---|---|---|---|---|---|---|---|---|
| AKLL | | | | | | | | | | |
| AKLS | | | | | | | | | | |
| AKLP | | | | | | | | | | |
| DAKLM | | | | | | | | | | |
| AKLM | | | | | | | | | | |
| DAKLZ | | | | | | | | | | |
| AKL1-X | | | | | | | | | | |
| AKL2-X | | | | | | | | | | |
| AKL1-FLE | | | | | | | | | | |
| AKL2-FLE | | | | | | | | | | |
| AKL1-H | | | | | | | | | | |
| AKL2-H | | | | | | | | | | |

Examples listed are not meant to be limiting or exhaustive in scope, but only serve to be representative examples of some possible substrates and reactive agents. Substrates are listed across the horizontal axis while the reactive agents are listed across the vertical axis.

VT=vinyltoluene, VIB=vinyliscpropylbenzene, EVB=ethylvinylbenzene,
VN=vinylnaphthalene, AMS=alpha-methylstryene, BMS=betamethylstyrene,
DVB=divinylbenzene, DVN=divinylnaphthalene,
PPYR=polypyridines such as poly(4-vinylpyridine), poly(2-vinylpyridine), polyquinolines such as poly(4-vinylquinoline), poly(2-vinylquinoline) and analogs thereof.
AKLL=alkyl lithium, AKLS=alkyl sodium, AKLP=alkyl potassium, DAKLM=dialkyl magnesium, AKLM=alkyl magnesium halide, DAKLZ=dialkyl zinc, where the alkyl group is an alkyl hydrocarbon radical containing from 1 to 12 carbon atoms. ALK1-X=alkali metal salts where X represents suitable anions such as halogens, carbonates, sulfates, nitrates, oxalates or phosphates. ALK2-X=alkaline earth metal salts where X represents suitable anions such as halogens, carbonates, sulfates, nitrates or phosphates, AKL1-FLE=alkali metal salts of fluorenone, AKL2-FLE=alkaline earth metal salts of fluorenone, AKL1-H=alkali metal hydrides and AKL2-H=alkaline earth metal hydrides.

hydrides and AKL2-H=alkaline earth metal hydrides, LAN-X=lanthanide metal salts where X represents suitable anions such as halogens, carbonates, sulfates, nitrates, oxalates or phosphates, GET-ALY1=getter alloys containing mixtures of zirconium, vanadium, iron, manganese, yttrium, lanthanum, Rare Earths or mixtures thereof. GET-ALY2=getter alloys containing mixtures of zirconium, cobalt, and rare earth metals, yttrium, lanthanum, and mixtures thereof.

Note that the substrates and reactive agents disclosed within Tables 2 and 3 are not meant to be limited, but rather combinations can be mixed and matched between columns and rows.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the disclosure. This specification contains numerous citations to patents, patent applications and publications. Each is hereby incorporated by reference for all purposes

TABLE 3

Matrix of Examples of Inorganic Substrates and Metallic Reactive Agents.

| | ALSILC | ALUMINA | SILICA | MS | TITANIA | ZIRCONIA | CARBON |
|---|---|---|---|---|---|---|---|
| TRN-X | | | | | | | |
| AKL1-X | | | | | | | |
| AKL2-X | | | | | | | |
| AKL1-H | | | | | | | |
| AKL2-H | | | | | | | |
| LAN-X | | | | | | | |
| GET-ALY1 | | | | | | | |
| GET-ALY2 | | | | | | | |

Examples listed are not meant to be limiting or exhaustive in scope, but only serve to be representative examples of some possible substrates and reactive agents. Substrates are listed across the horizontal axis while the reactive agents are listed across the vertical axis. Other substrates included but not listed in the table are yttria or vanadia. In addition metal salts that are listed as reactive agents can also be used as substrates with or without further coatings or functional groups. Analogously, substrates can be used without further functionalization for the removal of moisture and other oxygenated species.

ALSILC=aluminosilicates and silica-alumina complexes,
MS=Molecular Sieves of all types,
TRN-X=transition metal salts such as vanadium, molybdenum, antimony, bismith, tin, cerium, chromium, cobalt, copper, tungsten, iron, nickel, manganese, zinc, zirconium, silver, cadmium, rhenium and mixtures thereof where X represents suitable anions such as halogens, carbonates, sulfates, nitrates, oxalates or phosphates.
ALK1-X=alkali metal salts where X represents suitable anions such as halogens, carbonates, sulfates, nitrates, oxalates or phosphates. ALK2-X=alkaline earth metal salts where X represents suitable anions such as halogens, carbonates, sulfates, nitrates or phosphates, AKL1-H=alkali metal

What is claimed is:

1. An electronic device comprising:
   an interior compartment housing an electronic component that is reactive to target impurities, the compartment defining at least one transparent window; and
   a purifier material distributed as a plurality of unconnected discrete areas formed on a flexible film within the interior compartment; and
   wherein the purifier material has a first color indicating that the purifier material is reactive to target impurities and a second color indicating that the purifier material is not reactive to target impurities and wherein at least a portion of the purifier material can be viewed through the at least one transparent window.

2. The electronic device of claim 1 wherein the purifier material is selected from the group consisting of an organometallic reactive agent and a macroreticulated substrate and a metallic reactive agent and an inorganic substrate.

3. The electronic device of claim 2 wherein the purifier material is a color change purifier material that incorporates a target impurities indicator comprising cobalt chloride and wherein the cobalt chloride has at least a first and second color that are different dependent on whether a target impurity is present.

4. The electronic device of claim 2 wherein the purifier material is a color change purifier material that incorporates a target impurities indicator comprising $P_2O_5$ and wherein the $P_2O_5$ has at least a first and second color that are different dependent on whether a target impurity is present.

5. The electronic device of claim 1 wherein the electronic component comprises at least a cathode and anode and wherein the purifier material is positioned between the cathode or anode and the at least one transparent window.

6. The electronic device of claim 1 wherein the electronic component comprises at least a cathode and anode and wherein the purifier material is positioned outside of the cathode or anode and viewable through the at least one transparent window.

7. The electronic device of claim 1 wherein the electronic component comprises at least a cathode and anode and wherein the flexible film comprises a conducting polymer layer between the cathode or anode and the at least one transparent window.

8. The electronic device of claim 1 wherein the electronic device is selected from the group consisting of an organic light emitting diode, an organic transistor, a flat panel display, a liquid crystal display and electronic paper.

9. The electronic device of claim 1 wherein the purifier material comprises an organometallic reactive agent and a macroreticulated substrate.

10. The electronic device of claim 1 wherein the purifier material comprises a metallic reactive agent and an inorganic substrate.

11. The electronic device of claim 1 wherein the purifier material has a surface area of from about 20 $m^2/g$ to about 1200 $m^2/g$.

12. The electronic device of claim 1 wherein the discrete areas of the purifier material have a shape selected from the group consisting of powder, pellets, cylinders, tablets, granulates, extrudates, rods, spheres and other irregular discrete shapes.

13. The electronic device of claim 12 wherein the shape is sized from about 1 nm to about 1 cm in diameter.

14. The electronic device of claim 1 wherein the purifier material is formed on the flexible film using a glue, binder, or sealant.

15. An identifier alert for an electronic device comprising:
a binder material; and a color change purifier material comprising an organometallic reactive agent and a macroreticulated substrate distributed as a plurality of unconnected discrete areas operatively attached to a flexible film with the binder material;
wherein the flexible film is positioned within an interior portion of the electronic device and wherein the operatively attached color change purifier material has the potential to change colors when exposed to target impurities within the interior of the electronic device.

16. The identifier alert of claim 15 wherein the color change purifier material comprises a target impurities indicator of cobalt chloride.

17. The identifier alert of claim 15 wherein the color change purifier material comprises a target impurities indicator of phosphorus pentaoxide.

18. The identifier alert of claim 15 wherein the binder material is glue.

19. The identifier alert of claim 15 wherein the color change purifier material has a surface area of from about 20 $m^2/g$ to about 1200 $m^2/g$.

20. The identifier alert of claim 15 wherein the plurality of unconnected discrete areas of color change purifier material have a shape selected from the group consisting of powder, pellets, cylinders, tablets, granulates, extrudates, rods, spheres and other irregular discrete shapes.

21. An electronic device comprising:
an interior compartment housing an electronic component that is reactive to target impurities, the compartment defining at least one transparent window; and
a purifier material distributed as a plurality of unconnected discrete areas formed on a flexible film within the interior compartment; and
wherein the purifier material decreases target impurities within the interior compartment of the electronic device from a first level to a second level.

22. The electronic device of claim 21 wherein the purifier material is selected from the group consisting of an organometallic reactive agent and a macroreticulated substrate and a metallic reactive agent and an inorganic substrate.

23. The electronic device of claim 21 wherein the electronic component comprises at least a cathode and anode and wherein the purifier material is positioned between the cathode or anode and the at least one transparent window.

24. The electronic device of claim 21 wherein the electronic component comprises at least a cathode and anode and wherein the purifier material is positioned outside of the cathode or anode.

25. The electronic device of claim 21 wherein the electronic component comprises at least a cathode and anode and wherein the flexible film comprises a conducting polymer layer between the cathode or anode.

26. The electronic device of claim 21 wherein the electronic device is selected from the group consisting of an organic light emitting diode, an organic transistor, a flat panel display, a liquid crystal display and electronic paper.

27. The electronic device of claim 21 wherein the purifier material comprises an organometallic reactive agent and a macroreticulated substrate.

28. The electronic device of claim 21 wherein the purifier material comprises a metallic reactive agent and an inorganic substrate.

29. The electronic device of claim 21 wherein the purifier material has a surface area of from about 20 $m^2/g$ to about 1200 $m^2/g$.

30. The electronic device of claim 21 wherein the plurality of unconnected discrete areas of purifier material have a shape selected from the group consisting of powder, pellets, cylinders, tablets, granulates, extrudates, rods, spheres and other irregular discrete shapes.

31. The electronic device of claim 30 wherein the shape is sized from about 1 nm to about 1 cm in diameter.

32. The electronic device of claim 21 wherein the purifier material is formed on the flexible film using a glue, binder, or sealant.

33. An identifier alert for an electronic device comprising:
a binder material; and a color change purifier material comprising a metallic reactive agent and an inorganic substrate distributed as a plurality of unconnected discrete areas operatively attached to a flexible film with the binder material;
wherein the flexible film is positioned within an interior portion of the electronic device and wherein the operatively attached color change purifier material has the potential to change colors when exposed to target impurities within the interior of the electronic device.

34. The identifier alert of claim 33 wherein the color change purifier material comprises a target impurities indicator of cobalt chloride.

35. The identifier alert of claim 33 wherein the color change purifier material comprises a target impurities indicator of phosphorus pentaoxide.

36. The identifier alert of claim 33 wherein the binder material is glue.

37. The identifier alert of claim 33 wherein the color change purifier material has a surface area of from about 20 $m^2/g$ to about 1200 $m^2/g$.

38. The identifier alert of claim 33 wherein the plurality of unconnected discrete areas of color change purifier material have a shape selected from the group consisting of powder, pellets, cylinders, tablets, granulates, extrudates, rods, spheres, and other irregular shapes.

* * * * *

UNITED STATES PATENT AND TRADEMARK OFFICE
CERTIFICATE OF CORRECTION

| | | |
|---|---|---|
| PATENT NO. | : 7,553,355 B2 | Page 1 of 1 |
| APPLICATION NO. | : 10/875671 | |
| DATED | : June 30, 2009 | |
| INVENTOR(S) | : Robert Torres, Jr. et al. | |

It is certified that error appears in the above-identified patent and that said Letters Patent is hereby corrected as shown below:

Column 22, line 6, after "irregular" insert --discrete--

Signed and Sealed this

Third Day of November, 2009

David J. Kappos
*Director of the United States Patent and Trademark Office*